United States Patent
Weber et al.

(10) Patent No.: US 6,278,285 B1
(45) Date of Patent: Aug. 21, 2001

(54) CONFIGURATION FOR TESTING INTEGRATED COMPONENTS

(75) Inventors: Axel Weber, Hemhofen; Matthias Köhler; Michael Adam, both of Dresden, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/356,955

(22) Filed: Jul. 19, 1999

(30) Foreign Application Priority Data

Jul. 17, 1998 (DE) ................................. 198 32 284
Aug. 7, 1998 (DE) ................................. 198 35 862

(51) Int. Cl.$^7$ ................................. G01R 31/02
(52) U.S. Cl. .............. 324/755; 324/158.1; 324/756; 324/761; 439/66
(58) Field of Search .................. 324/754, 755, 324/757, 158.1, 761, 765; 361/220; 439/66; 206/719

(56) References Cited

U.S. PATENT DOCUMENTS

| 4,644,269 | * | 2/1987 | Golder et al. ................ 324/158.1 |
| 4,725,918 | * | 2/1988 | Bakker ........................ 361/220 |
| 5,450,017 | * | 9/1995 | Swart ......................... 324/754 |
| 5,652,523 |   | 7/1997 | Noguchi . |
| 5,729,147 | * | 3/1998 | Schaff ........................ 324/755 |
| 5,991,165 | * | 11/1999 | Jones, Jr. et al. ............ 361/816 |

FOREIGN PATENT DOCUMENTS

4433906A1  3/1995 (DE) .

* cited by examiner

Primary Examiner—Safet Metjahic
Assistant Examiner—Jimmy Nguyen
(74) Attorney, Agent, or Firm—Herbert L. Lerner; Laurence A. Greenberg; Werner H. Stemer

(57) ABSTRACT

A configuration for testing integrated components includes a carrier frame into which test bases for receiving components can be inserted. The test bases have a clamping device and contacts which are associated with a contact plate, so that the components can be connected electrically to a tester head.

6 Claims, 1 Drawing Sheet

CONFIGURATION FOR TESTING INTEGRATED COMPONENTS

BACKGROUND OF THE INVENTION

FIELD OF THE INVENTION

The present invention relates to a configuration for testing integrated components, having a carrier frame into which test bases for receiving the components can be inserted.

Integrated components and in particular memory components are known to be subjected to final tests to check them for perfect operation, before they are handed over to customers. In order to perform those final tests, carrier frames are used, into which test bases that in turn receive the individual memory components can be inserted.

It has now been found that in such existing configurations, contact failures regularly occur, which leads to a reduced yield in the final tests. The currently used test bases also have an average service life on the order of magnitude of only approximately 10,000 contacting operations. After those 10,000 operations, the test configuration must be dismantled n order to replace the original test bases in the carrier frame.

One example thereof that can be mentioned is memory components in a so-called TSOP housing. At a throughput of 4000 DUTs/hr. (DUT stands for Device Under Test, i.e., the test component), the test bases have to be replaced after approximately one week, which means a loss of at least one hour of production. Such a time loss is extremely undesirable with regard to the mass production of integrated components.

SUMMARY OF THE INVENTION

It is accordingly an object of the invention to provide a configuration for testing integrated components, which overcomes the hereinafore-mentioned disadvantages of the heretofore-known devices of this general type and in which time losses for replacing test bases are avoidable.

With the foregoing and other objects in view there is provided, in accordance with the invention, a configuration for testing integrated components, comprising a carrier frame; bases for insertion in the carrier frame and for receiving components, the bases having a clamping device for clamping the components and contacts for contacting the components; a tester head for testing the components; and a contact plate associated with the contacts for electrically connecting the components through the contacts and the contact plate to the tester head.

In accordance with another feature of the invention, a spring-loaded hinged lid or a clamping mechanism is used for the clamping device.

Thus, in the configuration of the invention, test bases that are equipped, for instance, with spring-loaded hinged lids are inserted into the carrier frames. However, it is also possible to construct these test bases without a hinged lid and to provide a clamping mechanism instead of the hinged lid.

In accordance with a concomitant feature of the invention, the contacts for the contact plate are SMD contacts (SMD stands for "surface mounted device") provided on the underside of the test bases, as a result of which secure contacting operations to test boards of the tester head are assured. Contact surfaces or contact pads of the contact plate are optimally adapted to the contacting mechanism including the hinged lid or clamping mechanism, so that no fluctuations in tolerance need be expected for an integrated component inserted into the test base. It has been found that after the integrated components have been inserted into the individual test bases, an extremely reliable contacting with the SMD contacts of the test base is assured. This is attained through the use of the individual hinged lids and/or clamping mechanisms on the top of the test bases, which reliably press the individual components onto the SMD contacts. These contacts then in turn gain a good contact with the gold-coated contact surfaces of the contact plate.

The contact plates are constructed in such a way that they are universally usable. This means that if the housing of an integrated component to be tested is changed, the only item that needs to be replaced is the carrier frames, so that the configuration of the invention is extremely flexible and versatile in terms of its use. The individual test bases in the carrier frame can also be replaced quickly once their service life has ended, so that the production loss entailed by such replacement is extremely slight.

An essential feature of the configuration of the invention is the test bases with the SMD contacts and the universally usable contact plates that fit them. Through the use of short base contacts and conductor tracks, it can also be assured that the configuration according to the invention is especially suited to measuring high frequencies, as can be demanded for memory components in the most varied types of housings.

Other features which are considered as characteristic for the invention are set forth in the appended claims.

Although the invention is illustrated and described herein as embodied in a configuration for testing integrated components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
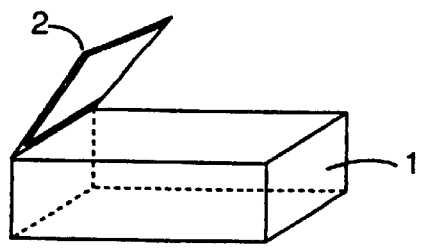
FIG. 1 is a diagrammatic, perspective view of a test base, in which SMD contacts have not been shown.
Figure 2:
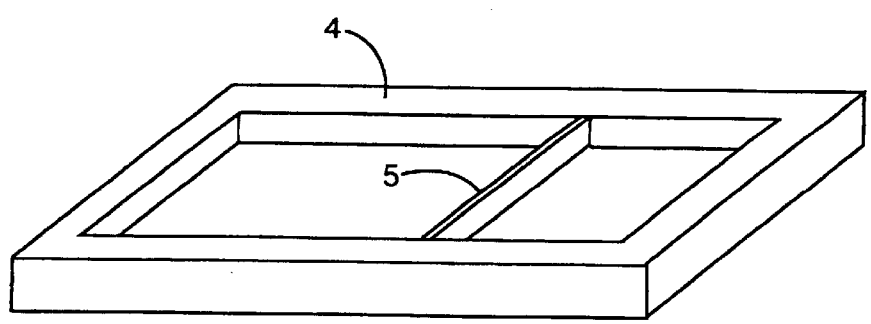
FIG. 2 is a perspective view of a carrier frame.
Figure 3:
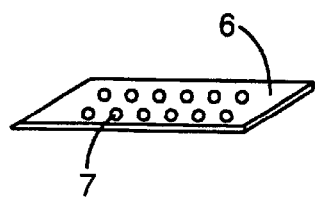
FIG. 3 is a perspective view of a contact plate.
Figure 4:
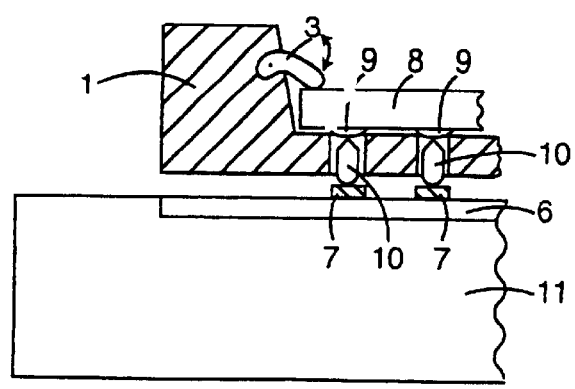
FIG. 4 is a fragmentary, sectional view through the configuration of the invention.

Referring now to the figures of the drawings in detail and first, particularly, to FIGS. 1 and 4 thereof, there is seen a test base 1 into which an integrated component 8 can be placed. This test base 1 is equipped with a spring-loaded hinged lid 2 (see FIG. 1) or a clamping mechanism 3 (see FIG. 4). The hinged lid 2 or clamping mechanism 3 presses the integrated component 8, placed in the test base 1, downward in the correct position. In this way, contact points 9 of this component 8 act through resilient SMD contacts 10 to reliably make contact with gold-coated contact surfaces 7 on a contact plate 6 (see FIG. 3). These gold-coated contact surfaces 7 are in turn electrically connectable through coaxial lines to a tester head 11, which is disposed on a side of the contact plate 6 opposite the test base 1. The contact plate 6 is screwed firmly to the tester head 11 and connected to it with wires.

Figure 5:
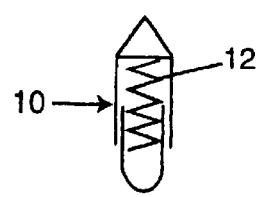
FIG. 5 is an enlarged, elevational view of an SMD contact.

FIG. 5 diagrammatically shows the structure of SMD contacts 10, with a spring 12 that presses two contact halves apart.

Many test bases 1 are placed in one carrier frame 4, which may optionally be provided with compartments 5.

The preferably gold-coated SMD contacts 10 of the test base 1 are optimally adapted to the contacting mechanism, which includes the test base 1 and the hinged lid 2 or clamping mechanism 3. Therefore, no fluctuations in tolerance occur, and the component 8 placed in the test base 1 is reliably contacted.

The compartments 5 in the carrier frame 4 may optionally be omitted.

If different housings are used for the same component, then all that is needed is to replace the carrier frame 4, as long as the contact plates 6 are made in a universal form. The individual test bases 1 can also be easily replaced, since the contact plates 6 are usable everywhere.

We claim:

1. A configuration for testing integrated components, comprising:

a carrier frame;

bases for insertion in said carrier frame and for receiving components, said bases having a clamping device for clamping the components and contacts for contacting the components;

a tester head for testing the components; and a contact plate associated with said contacts for electrically connecting the components through said contacts and said contact plate to said tester head.

2. The configuration according to claim 1, wherein said clamping device is a spring-loaded hinged lid.

3. The configuration according to claim 1, wherein said clamping device is a clamping mechanism.

4. The configuration according to claim 1, wherein said contact plate has gold-coated SMD contact surfaces.

5. The configuration according to claim 4, wherein said contacts are spring-loaded SMD contacts.

6. The configuration according to claim 5, wherein said SMD contacts are gold-coated.

* * * * *